United States Patent

[11] 3,566,958

[72] Inventor William B. Zelina
Edinboro, Pa.
[21] Appl. No. 784,557
[22] Filed Dec. 18, 1968
[45] Patented Mar. 2, 1971
[73] Assignee General Systems, Inc.
Erie, Pa.

[54] HEAT SINK FOR ELECTRICAL DEVICES

4 Claims, 2 Drawing Figs.

[52] U.S. Cl. .......... 165/80, 165/185, 317/234
[51] Int. Cl. .......... H01l 1/12
[50] Field of Search .......... 165/80, 185; 317/234; 62/3

[56] References Cited

UNITED STATES PATENTS

| | | | |
|---|---|---|---|
| 2,936,409 | 5/1960 | Jackson et al. | 165/80X |
| 3,005,945 | 10/1961 | Salzer | 317/234X |
| 3,280,907 | 10/1966 | Hoffman | 165/185 |
| 3,293,508 | 12/1966 | Boyer | 317/234 |

FOREIGN PATENTS

| | | | |
|---|---|---|---|
| 1,248,814 | 8/1967 | Germany | 317/234 |

*Primary Examiner*—Albert W. Davis, Jr.
*Attorney*—Charles L. Lovercheck

ABSTRACT: A cooling structure for pressure mounting electrical components having opposed contact surfaces wherein spring clamp means electrically insulated from and in clamping engagement with the edges of oppositely disposed heat dissipating members urges the members together to provide a pressure mounting heat sink for an electrical component disposed therebetween; the spring clamp means externally applying and maintaining a predetermined force on the component to effect the proper electrical and thermal contact between the component and the heat dissipating members.

Figure 1:
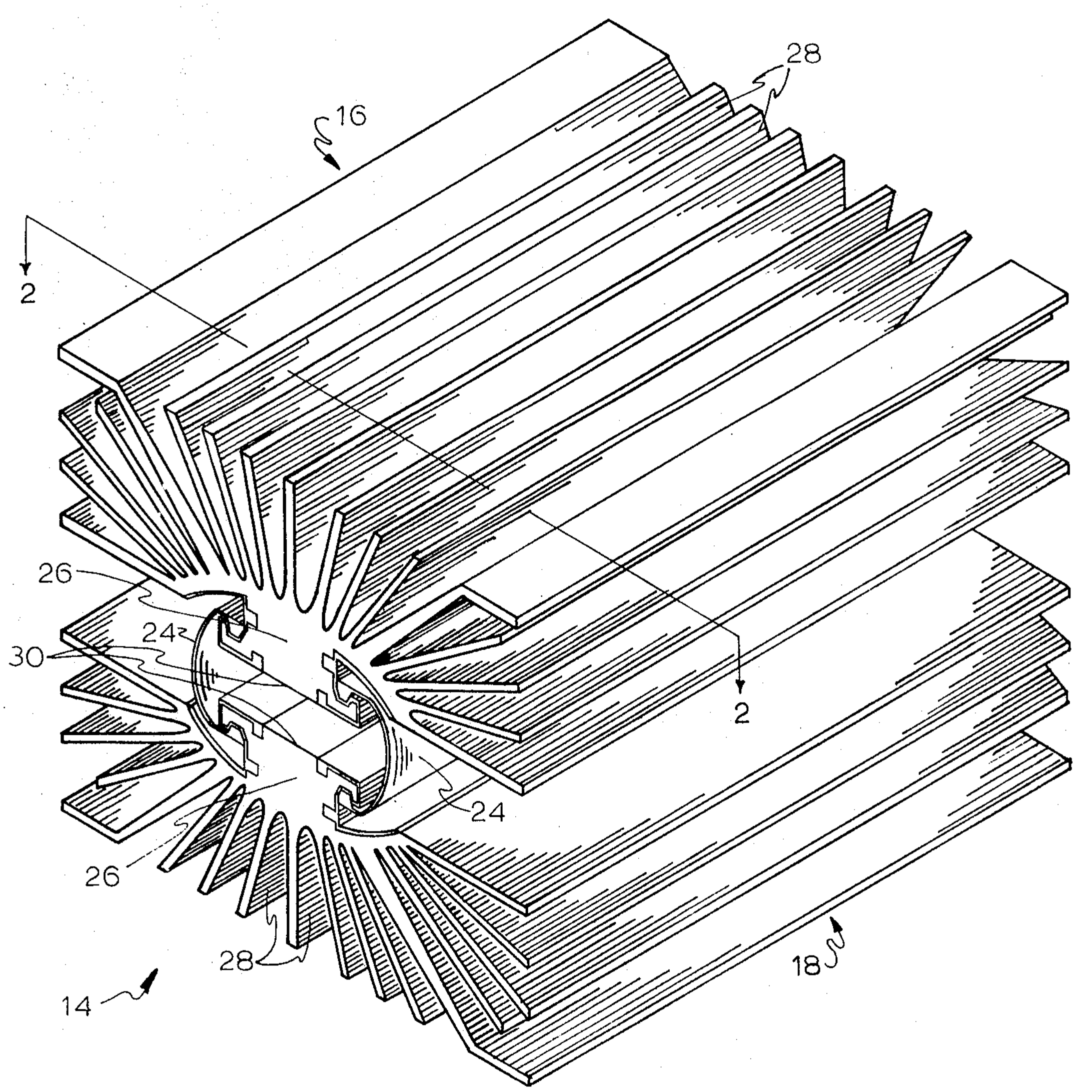

INVENTOR.
WILLIAM B. ZELINA
BY Joseph V. Claeys
HIS ATTORNEY

INVENTOR.
WILLIAM B. ZELINA
BY Joseph V. Claeys
HIS ATTORNEY

HEAT SINK FOR ELECTRICAL DEVICES

This invention relates generally to cooling structures for electrical components having opposed contact surfaces and more particularly to cooling structures for semiconductor devices of the so-called flat-pack type. That is, pressure mounted devices wherein pressure is externally applied and retained. Usually, proper electrical and thermal contact is maintained by pressure mounting the flat-pack device between two heat transfer members.

Various pressure mount heat sink arrangements are known in the art but all such arrangements are either too costly, complex, or bulky to be entirely satisfactory and suitable for wide general application. Also, since the heat sink for the component must be able to clamp the device with a pressure of more than 700 pounds force while remaining parallel with the contact surface of the component, suitable spring arrangements and mounting clamps have been required. Even with such arrangements, however, bending moments are present unless great care is exercised in mounting the heat sink to the flat-pack device. Moreover, in some arrangements one of the heat transfer members is adapted to be ridgedly mounted while the other member is allowed to float. Such an arrangement is not entirely satisfactory for many applications since the normal shocks encountered during operation often cause uneven forces to be applied to the contact surface of the device.

It is an object of this invention, therefore, to provide a new and improved pressure-mount cooling structure which substantially overcomes one or more of the prior art difficulties.

It is another object of the invention to provide a pressure-mount cooling structure which includes a resilient clamping means which inherently applies and maintains a predetermined and even pressure force on the contact surfaces of the flat-pack device.

It is a further object of the invention to provide a pressure mount cooling structure which is simple in construction and easy to assemble and disassemble.

Briefly stated, in accordance with one aspect of the invention, there is provided a new and improved cooling structure for pressure mounting electrical components having opposed contact surfaces. A pair of heat transfer members are provided which are adapted to be disposed in opposed relationship with their inner parallel faces abutting the contact surfaces of the electrical component. Resilient means are provided and are electrically isolated from but in operative engagement with the opposed heat transfer members and function to urge the heat transfer members together for providing a preselected pressure contact between the heat transfer members and the contact surfaces of the electrical component.

Figure 2:
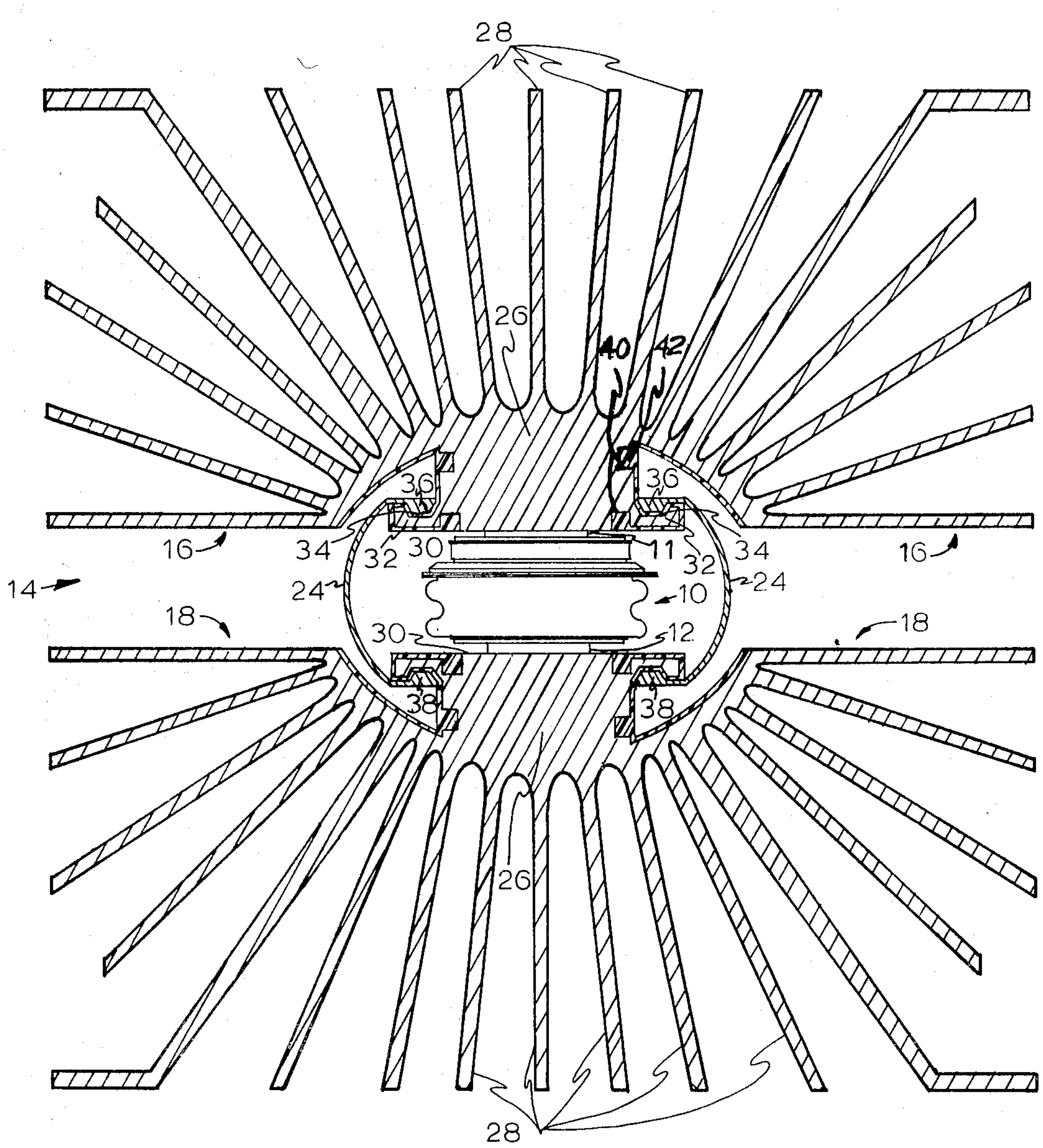

The novel features believed characteristic of the invention are pointed out with particularity in the appended claims. The invention itself, however, both as to its organization and method of operation, as well as further objects and advantages thereof, may best be understood by reference to the following description taken in conjunction with the accompanying drawing in which:

FIG. 1 is a perspective view of a cooling structure in accordance with one embodiment of the invention; and FIG. 2 is a sectional view taken along the line 2–2 of FIG. 1 showing the arrangement of the pressure-mounted semiconductor device.

Referring now to the drawing, there is shown in FIGS. 1 and 2 a semiconductor device 10 of the flat-pack type, having opposed contact surfaces 11 and 12, pressure mounted in a cooling structure 14 constructed in accordance with one embodiment of the invention. As shown, cooling structure 14 comprises a pair of heat transfer members 16 and 18, which may be of aluminum, having corresponding walls making electrical and thermal contact with the contact surfaces 11 and 12 respectively of the semiconductor device 10. The required pressure to assure proper electrical and thermal contact is applied and maintained by spring clamp means 24 disposed along the edges of the heat transfer members.

Each of the heat transfer members 16 and 18 comprises a base portion 26 having a plurality of spaced-apart heat radiating walls, or fins, 28 integral with and extending from one side of the base portion. The opposite side of base portion 26 has a contact surface 30 a part of which is adapted to make an intimate heat conducting engagement with the contact surface of an electrical component. The contact surfaces 30 therefore comprise inner parallel faces abutting the contacting surfaces of the electrical component.

While the heat transfer members have been illustrated with open heat radiating walls 28, it will be understood that cooling liquid passages may be provided by the provision of suitable enclosing walls therefor.

Each of the heat transfer members 16 and 18 is provided with integral longitudinally extending lugs 32 at the edges thereof. Preferably, lugs 32 are coextensive with the heat transfer member and provided with a channel 34. The outer surface of lugs 32, and of the regions immediately adjacent thereto are suitably electrically insulated, such as by applying thereto a layer of suitable electrically insulating material. Alternatively, a separate body of a suitable electrically insulating material may be formed to shape, as by extrusion, for fitting about the lugs 32 and/or into the channels 34. The extruded body of insulation can be secured to the lug by the use of grooves 40 in the lug on either side of the channel 34 and of mating portions 42 on the body fitting into the grooves 40. In another alternative, the entire spring clamp means, or at least the end portions thereof, may be provided with a layer of a suitable electrically insulating material so that such spring clamp means are electrically isolated from the heat transfer members which they urge together.

The electrically insulating material should exhibit good dielectric properties and adequate resistance to deformation under load at the highest temperature to which the heat transfer members are expected to be subjected during operation. There are many suitable thermoplastic or thermosetting electrically insulating material which may be employed for this purpose.

Some examples of suitable materials are the polycarbonates, the epoxides and the phenolics. The polycarbonates are high heat resistant thermoplastic materials having a desirable combination of properties, such as superior toughness, thermal and dimensional stability, high compression strength even at temperatures above 200° F., and the ability to retain these properties over a wide temperature range. Moreover, the polycarbonates are rigid but not brittle. The epoxides also have a desirable combination of properties such as high dielectric strength, excellent adhesion to metals and high temperature stability and compression strength. The phenolics are relatively low cost materials, easy to process, are suitable for use for extended periods at temperatures of 300° F. and above and have outstanding resistance to deformation under load. Moreover, the phenolics are commonly produced in various forms including extrusions.

Spring clamp means 24 are disposed at the edges of the heat transfer members 16 and 18 so that one end 36 thereof engages the electrically insulated lugs 32 of one heat transfer member and the other end 38 engages the electrically insulated lugs 32 of the other heat transfer member. Thus, spring clamp means 24 resiliently clamp the heat transfer members together with a force determined by the size, configuration constants etc. of the spring clamp means 24. Since spring clamp means 24 extend longitudinally of the heat transfer members the desired clamping force on the contact surfaces 11 and 12 of the semiconductor device 10 is readily achieved. Moreover, the foregoing spring clamping arrangement assures that the force applied will be maintained at the desired amount as well as always being even.

I claim:

1. A cooling structure for pressure mounting an electrical component having opposed contacting surfaces comprising:

a. a pair of heat transfer members adapted to be disposed in opposed relationship,
b. each of said heat transfer members having a base;
c. each base having an inner parallel face in intimate contact with the contacting surfaces of said electrical component;
d. laterally extending lugs fixed to said base and extending laterally therefrom, each lug having a channel portion extending longitudinally of said base;
e. spring clamp means having ends overlying said lugs urging said heat transfer members toward each other and into intimate engagement with said electrical components; and
f. and electrical insulation between said clamp means and said lugs whereby said heat transfer members are electrically isolated from each other, said electrical insulation comprising a member fitting into said channel and having portions mating with grooves on each side of said lug to secure the insulation to said lug.

2. The cooling structure recited in claim 1 wherein said electrical insulation comprises a layer of electrically insulating material disposed adjacent said spring clamp means opposite ends of each of which extend longitudinally along a major portion of and engage with the extending portions of oppositely disposed heat transfer members for urging such members together and effecting the preselected pressure contact between the heat transfer members and the opposed contacting surfaces of said electrical component.

3. The cooling structure recited in claim 2 wherein each of said heat transfer members is an integral, extruded metal unit.

4. The cooling structure recited in claim 3 wherein said layer of electrically insulating material comprises separate extruded members one operatively fitted about each of said longitudinally and laterally extending portions at the sides of said heat transfer members.